United States Patent
Kuan et al.

(10) Patent No.: US 11,527,479 B2
(45) Date of Patent: Dec. 13, 2022

(54) STEPPED INTERPOSER FOR STACKED CHIP PACKAGE

(71) Applicant: Intel Corporation, Santa Clara, CA (US)

(72) Inventors: Chin Lee Kuan, Pahang (MY); Bok Eng Cheah, Pinang (MY); Jackson Chung Peng Kong, Pinang (MY)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 17/089,744

(22) Filed: Nov. 5, 2020

(65) Prior Publication Data
US 2022/0077065 A1    Mar. 10, 2022

(30) Foreign Application Priority Data
Sep. 4, 2020 (MY) .............................. PI2020004596

(51) Int. Cl.
| | |
|---|---|
| *H01L 23/538* | (2006.01) |
| *H01L 25/065* | (2006.01) |
| *H01L 21/768* | (2006.01) |
| *H01L 23/64* | (2006.01) |
| *H01L 21/56* | (2006.01) |
| *H01L 23/50* | (2006.01) |

(52) U.S. Cl.
CPC ........ *H01L 23/5384* (2013.01); *H01L 21/565* (2013.01); *H01L 21/76802* (2013.01); *H01L 23/50* (2013.01); *H01L 23/5385* (2013.01); *H01L 23/5386* (2013.01); *H01L 23/642* (2013.01); *H01L 23/645* (2013.01); *H01L 23/647* (2013.01); *H01L 25/0657* (2013.01)

(58) Field of Classification Search
CPC ............. H01L 23/5384; H01L 23/5386; H01L 25/0657
USPC ........................................................ 257/774
See application file for complete search history.

(56) References Cited

U.S. PATENT DOCUMENTS

| | | | |
|---|---|---|---|
| 2008/0296056 A1* | 12/2008 | Kinoshita | ......... H01L 23/49822 29/846 |
| 2012/0129301 A1* | 5/2012 | Or-Bach | ............. H01L 27/1203 438/129 |

* cited by examiner

*Primary Examiner* — Quoc D Hoang
(74) *Attorney, Agent, or Firm* — Viering, Jentschura & Partner mbB

(57) ABSTRACT

A chip package including a chip; a substrate; an interposer module including a first layer having a larger surface area than the surface area of a second layer, wherein a bottom of the second layer is attached to a top of the first layer area creating an exposed surface area of the first layer; via openings extending at least partially through the first layer; via openings extending at least partially through the first layer and the second layer; a plurality of conductive routing electrically coupled between the via openings, wherein the chip is electrically coupled to the via openings of a top of the second layer, wherein the substrate is electrically coupled to via openings of a bottom of the first layer; and an electronic component electrically coupled to the via openings of the exposed surface area of the first layer.

16 Claims, 9 Drawing Sheets

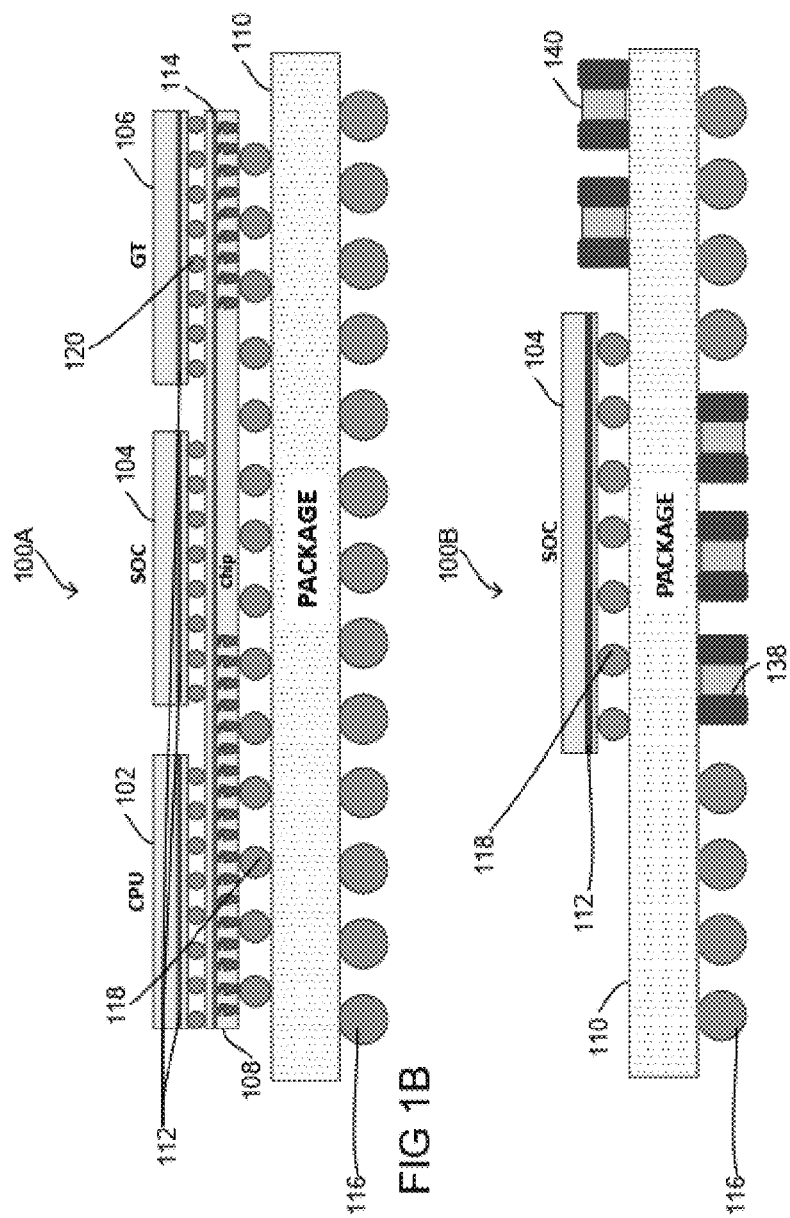

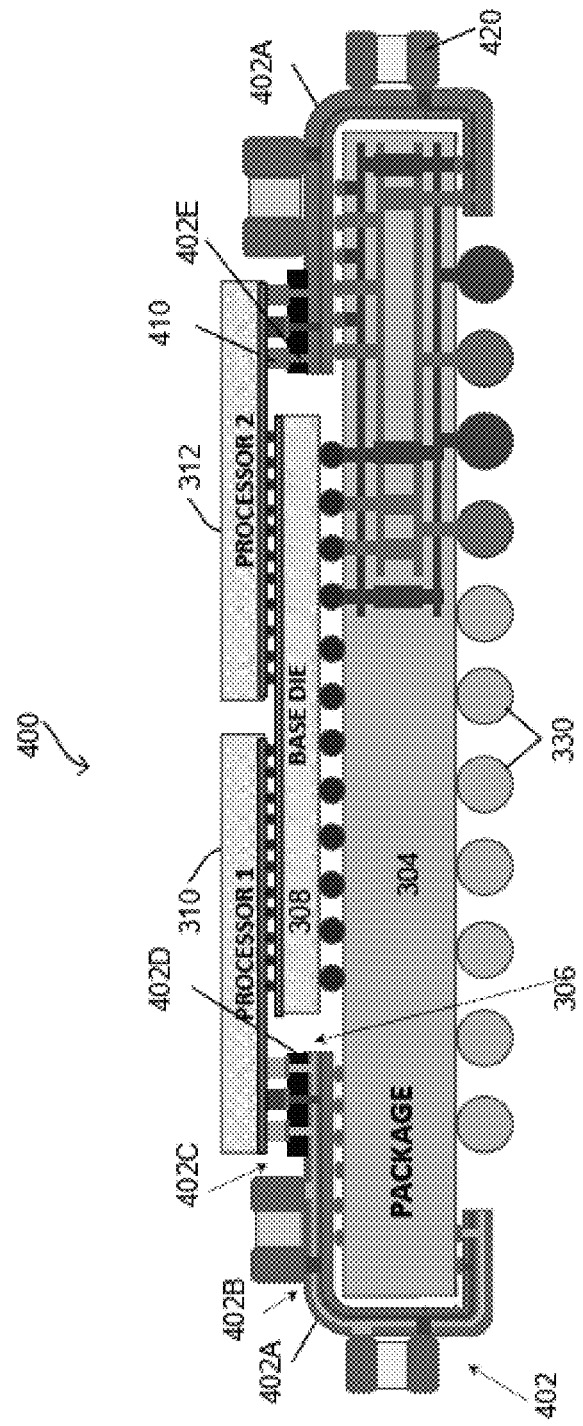

STEPPED INTERPOSER FOR STACKED CHIP PACKAGE

CROSS-REFERENCE TO RELATED APPLICATIONS

This application claims priority to Malaysian Patent Application No. PI2020004596, filed on Sep. 4, 2020, which is incorporated by reference herein in its entirety.

TECHNICAL FIELD

Various aspects relate generally to the field of interposer manufacturing. More particularly devices and methods of creating an electrical interface for routing between elements of a chip package.

BACKGROUND

Stacked chip packages face the challenge of accommodating electrical components while miniaturizing devices. For example, package capacitors and silicon metal-insulator-metal capacitance (MIMCap) are common decoupling technology used for power delivery noise mitigation in 2.5D package architecture. Because stacked chip packages are being miniaturized, accommodating decoupling technology without increasing form factor or product cost is desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. It should be understood that the drawings are diagrammatic and schematic representations of exemplary aspects of the invention, and are neither limitative nor necessarily drawn to scale of the present invention.

In the following description, various aspects of the invention are described with reference to the following drawings, in which:

FIGS. 1A and 1B show a chip package including power delivery noise mitigation.

FIG. 4A shows a chip package including a flexible stepped interposer module frames for power delivery and signal transmission according to some aspects.

DESCRIPTION

Figure 2A:
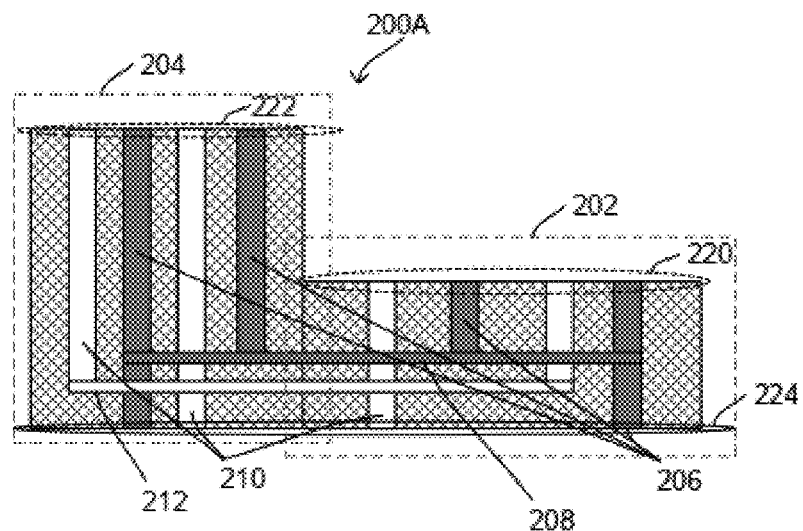
FIGS. 2A and 2B show a stepped interposer module frame according to some aspects.

The following detailed description refers to the accompanying drawings that show, by way of illustration, specific details and aspects of aspects in which the aspects of this disclosure are practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

The term chips (also referred to herein as "silicon dies") are generally "packaged" prior to shipping and merging with other electronics packages. This packaging typically involves encapsulating the chips in a material and providing electrical contacts on the outside of the housing to provide an interface for the chip. Among other things, chip packaging can provide protection against impurities, provide mechanical support, dissipate heat and reduce thermo-mechanical stress. Additionally, the term "chiplet" may refer to a chip positioned on a base die. The chiplet may be smaller in size than the base die.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Although a die may refer to a processor chip, a radio frequency (RF) chip, an integrated passive device (IPD) chip, or a memory chip may be mentioned in the same sentence, but it should not be construed that they are equivalent structures. The appearance of the phrase "aspect" various places throughout this disclosure are not necessarily all referring to the same aspect. Furthermore, the particular features, structures, or characteristics may be combined in any suitable manner in one or more aspects.

Various features are grouped together for the purpose of streamlining the disclosure. This method of disclosure is not to be interpreted as reflecting an intention that the claims require more features than are expressly recited in each claim Rather, as the following claims reflect, inventive subject matter lies in less than all features of a single disclosed aspect. Thus, the following claims are hereby incorporated into the Detailed Description, with each claim standing on its own as a separate aspect.

FIG. 1A illustrates a chip package 100A including metal-insulator-metal capacitance (MIMCap) for power delivery noise mitigation. Chip package 100A includes chiplets 102, 104, and 106, base die 108, and package substrate 110. Base die 108 includes high density MIM 114 connected to through silicon vias (TSV). Chiplets 102, 104, and 106 include a MIM layer 112. Chiplets 102, 104, and 106 may be electrically coupled to base die 108 through a plurality of micro-bumps 120. Base die 108 may be connected to package substrate 110 through its TSVs and solder bumps 118. Chip package 100A may connect to the main power delivery path through solder balls 116 on the land side of the package substrate 110.

FIG. 1B illustrates a chip package 100B including land-side capacitors (LSC) 138 and die-side capacitors (DSC) 140 for power delivery noise mitigation. Chip package 100B includes many of the same components described in Chip package 100A. However, chiplet 104 is directly connected to package substrate 110 through solder bumps 118. LSC 318 and DSC 140 may be coupled to chip 104 through routing of substrate 110 and through solder bumps 118.

FIG. 2A illustrates a stepped interposer module frame 200A. Stepped interposer module frame 200A includes first step 202 (the shorter step) and second step 204 (the taller step). Stepped interposer module frame 200A may be configured to have step 202 to the left of or to the right of step 204 depending on the necessary placement of stepped interposer module frame 200A within a chip package. Steps 202 and 204 may be made from the same material, for example, molding material. Stepped interposer module frame 200A may be configured to electrically couple a device attached to the top surface 220 of step 202 with a device attached to the top surface 222 of step 204. Bottom surface 224 of stepped interposer module frame 200A may be electrically coupled to a chip package substrate. Devices may be connected through vertical frame VIAs 206 and 210 extending through steps 202 and 204. The frame VIAs may be connected through frame routing 208 and 212. For example, frame VIAs 210 and frame routing 212 may be configured for VCC power routing and frame VIAs 206 and frame routing 208 may be configured for VSS ground routing. Alternatively, frames and routing may be configured for data signal routing. Multiple power voltages may be routed through stepped interposer module frame. Each power voltage may be routed through a designated configuration of frame VIAs and routing.

Figure 2B:
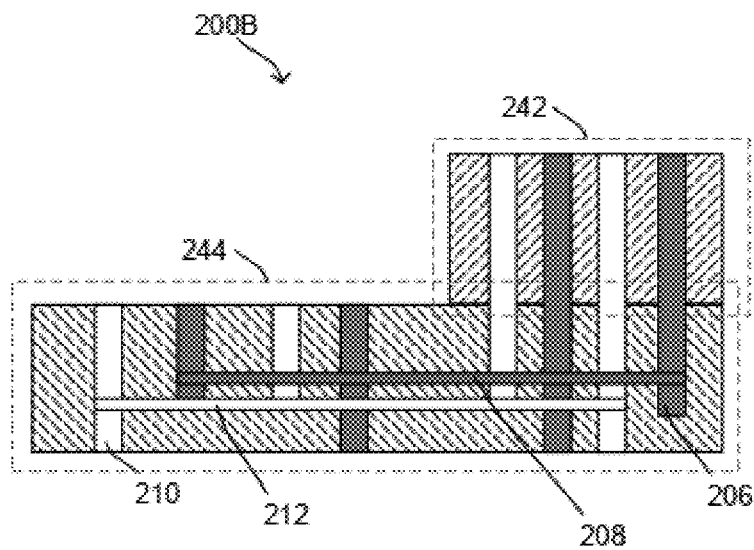

FIG. 2B illustrates a stepped interposer module frame 200B. Stepped interposer module frame 200B is similar to stepped interposer module frame 200A. It may be configured with similar frame VIAs 206 and 210 which are interconnected through frame routing 208 and 212. Stepped interposer module frame 200B includes two layers, first layer 244 and second layer 242. First layer 244 may be made of flexible material capable of wrapping around a chip package substrate. First layer 244 may make up first step 202 of FIG. 2A. Second layer 242 may be made of several types of material, for example molding material. Second layer 242 may be positioned directly on first layer 244. The combination of first layer 244 and second layer 242 may make up second step 204 of FIG. 2A. Stepped interposer module frame 200B may include similar frame routing 208, 212 and frame VIAs 206, 210 as illustrated FIG. 2A to interconnect electrical components of a chip package.

Figure 3:
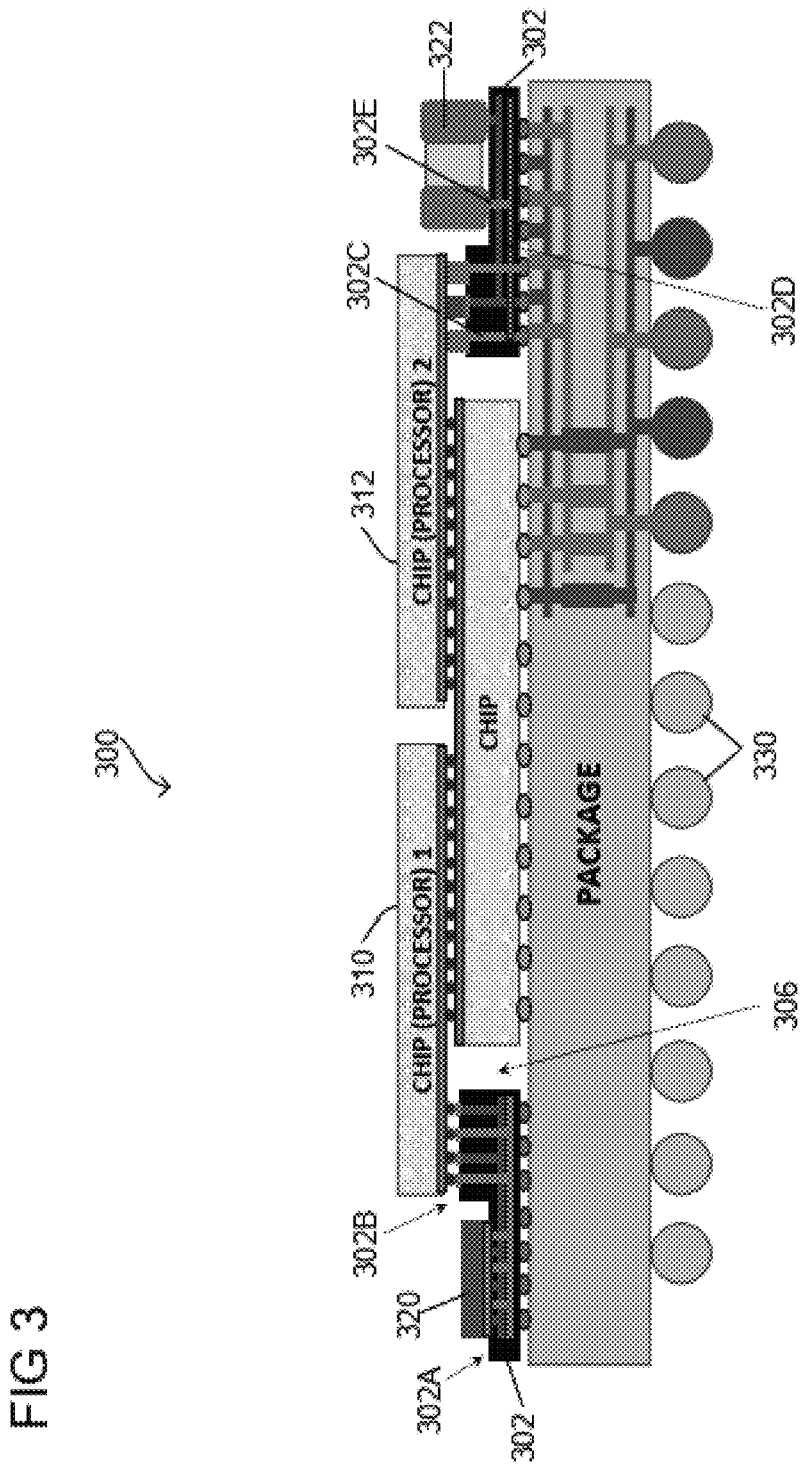
FIG. 3 shows a chip package including stepped interposer module frames for power delivery and signal transmission according to some aspects.

FIG. 3 illustrates a chip package 300 including stepped interposer module frames 302 for power delivery and signal transmission. FIG. 3 illustrates two modules 302 for simplicity. In an aspect, the modules 302 may form an integral structure, the interposer cavity 306, and encircle at least one of the peripherals of base die 308 positioned in interposer cavity 306. Elements depicted in one module are assumed to exist in the other module. Chip package 300 may include package substrate 304. Base die 308 may be positioned in interposer cavity 306 between the two interposer modules 302 and directly connected to a die-side of package substrate 304. Land side of package substrate 304 may be configured with solder balls in ball grid array 330 to electrically couple the chip package to external components, for example, a motherboard or a printed circuit board. Stepped interposer module frames 302 may be made from different materials. For example, interposer module frames 302 may be made from molding material. Stepped interposer module frames 302 may include a first step 302A (the shorter step) which is shorter than second step 302B (the taller step). The first step 302A may be configured to connect with electronic devices 320 and 322. For example, electronic device 320 may be an I/O chip and device 322 may be a capacitor. Frame VIAs 302E may extend through the first step 302A to couple with package substrate 304 and/or frame VIAs 302C through frame routing 302D. Frame VIAs 302C may extend through the first step 302A and/or the second step 302B. Frame VIAs 302C extending through second step 302B may be configured to electrically couple with chiplets 310 and/or 312 for power delivery or data signal transmission. Frame routing 302D may be configured to connect frame VIAs 302E and 302C. Chiplets 310 and 312 may be electrically coupled with devices 320 and 322 respectively through frame VIAS 302E, 302C and frame routing 302D of modules 302.

FIG. 4A illustrates a chip package 400 which is similar to chip package 300. However chip package 400 includes two stepped interposer modules 402 as described in FIG. 2B. Interposers 402 include a first step 402B made from a flexible cable 402A which may wrap around a die side, peripheral wall, and land side of package substrate 304 as illustrated in FIG. 4. Second step 402C may include a molded frame 402D attached to flexible cable 402A. Stepped interposer modules 402 include frame VIAs 402E and frame routing as previously described in at least FIGS. 2A and 2B. Frame VIAs and frame routing of interposer modules may be used to electrically couple chiplets 310 and 312 with capacitors 420. Capacitors 420 may be coupled to different power rails or power supply voltages depending on the requirements of chiplets 310 and 312. Chiplets 310 and 312 may be coupled to the top surface of the second step 402C through micro bumps 410.

Figure 4B:
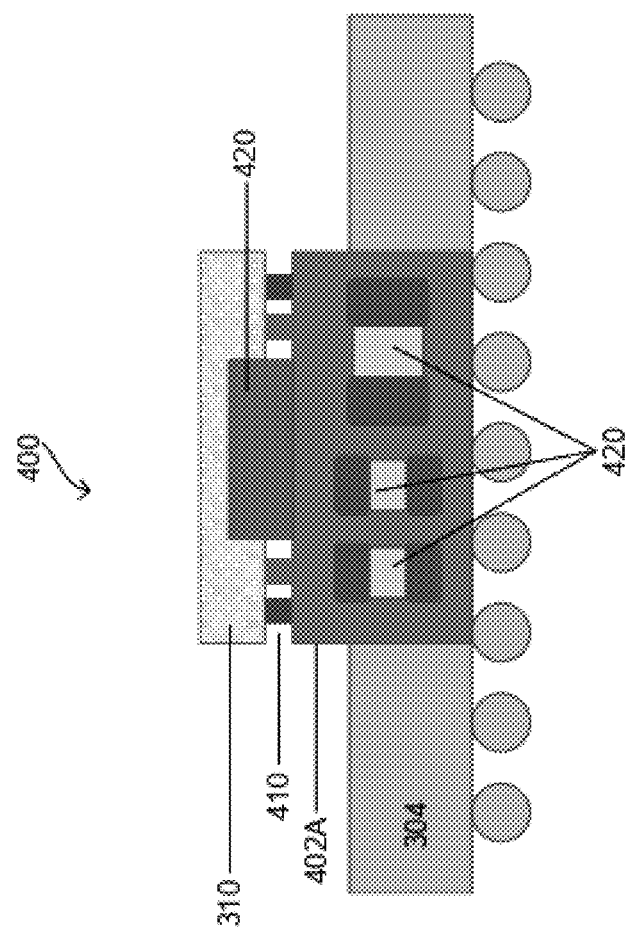
FIG. 4B shows a side view of a chip package including a flexible stepped interposer module frame wrapped around a peripheral sidewall of a package substrate according to some aspects.

FIG. 4B illustrates a side view of chip package 400. Flexible cable 402A may wrap around a peripheral sidewall of package substrate 304. Electronic devices may be electrically coupled to flexible cable 402A. For example, capacitors 420 may be electrically coupled to flexible cable 402A on its horizontal top surface or vertically along the portion of flexible cable 402A lateral to the peripheral sidewall of package substrate 304. Micro bumps 410 may electrically couple the second step 402C (not shown) of stepped interposer module 402 to chiplet 310. Each of the capacitors 420 may be coupled to different power rails and/or power supply voltages.

FIGS. 5A-5I illustrate a method of manufacture for a chip package including stepped interposer module frames.

Figure 5A:
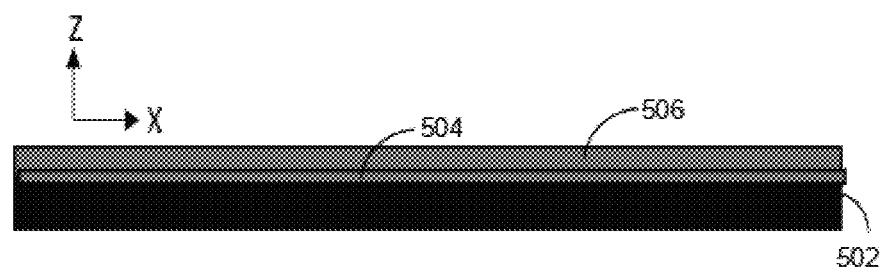
FIGS. 5A-5I show a method of manufacture for a chip package including stepped interposer module frames according to some aspects.

FIG. 5A illustrates disposing an adhesive layer 504 over carrier layer 502 and attaching flexible cable 506 to the carrier layer 502 with the adhesive layer 504. Flexible cable 506 may already be configured to include frame VIAs and/or frame routing. For example, applying the adhesive layer 504 and flexible cable 506 using a lamination process.

Figure 5B:
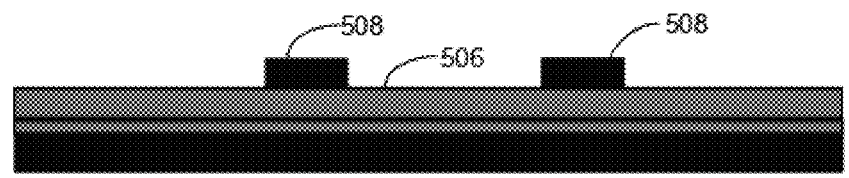

FIG. 5B illustrates disposing mold frames 508 directly on flexible cable 506. For example, using compression, injection, or transfer molding processes to attached mold frames 508 to flexible cable 506.

Figure 5C:
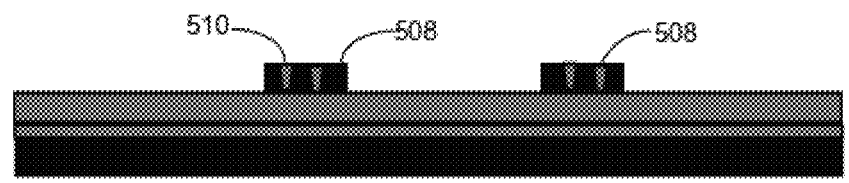

FIG. 5C illustrates forming frame VIAs 510 in mold frames 508. The frame VIAs 510 may be formed to connect with internal frame routing or frame VIAs of flexible cable 506. For example, using a laser drilling, paste printing, or plating process to form frame VIAs 510.

Figure 5D:
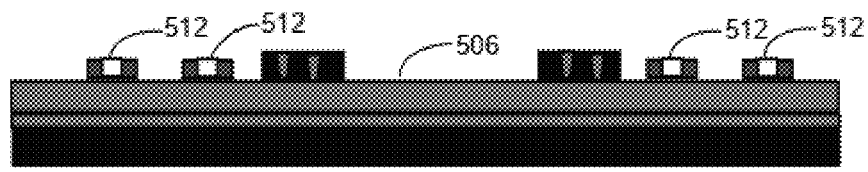

FIG. 5D illustrates attaching electronic devices 512 directly to flexible cable 506. Electronic devices 512 may be passive components such as ceramic capacitors and/or silicon capacitors. For example, attaching ceramic capacitor 512 to flexible cable 506 using reflow or thermal compression bonding processes.

Figure 5E:
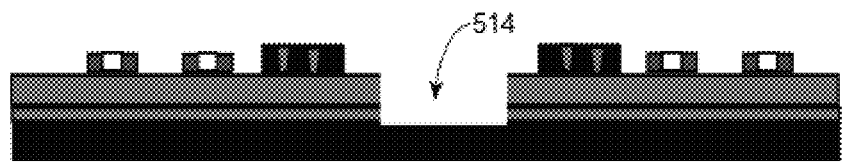

FIG. 5E illustrates removing a portion of flexible cable 506 to form interposer cavity 514. For example, removing a portion of flexible cable 506 using mechanical or laser drilling processes.

Figure 5F:
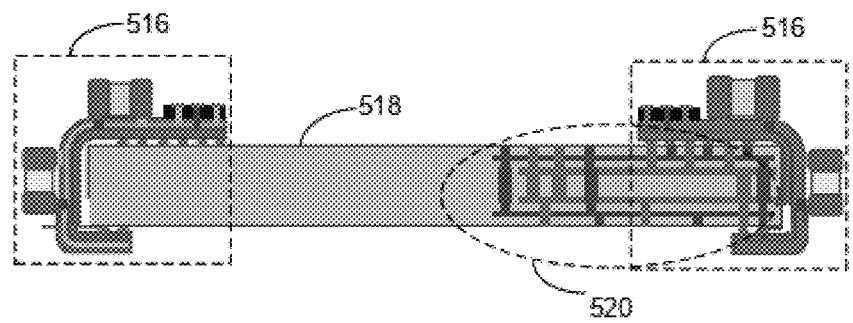

FIG. 5F illustrates two stepped interposer modules or integrated stepped interposer modules 516 created after removing carrier layer 502 from the step in FIG. 5E and attaching stepped interposer modules 516 on package substrate 518. For example, integrated stepped interposer modules in a single piece of flexible cable 506 with a cavity 514 in between modules 516. Electrically coupling stepped interposer modules 516 to substrate routing 520. As shown in FIG. 5F, flexible cable 506 of interposer modules 516 may be wrapped around substrate 518. For example, attaching stepped interposer modules 516 to substrate 518 using reflow or thermal compression bonding processes.

Figure 5G:
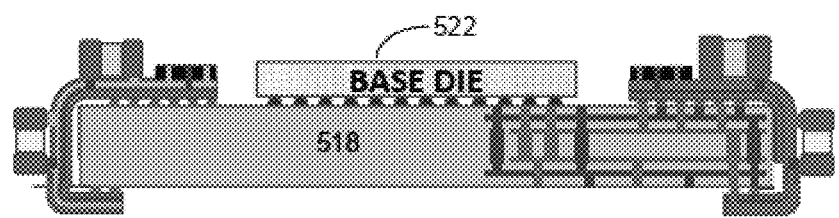

FIG. 5G illustrates attaching a base die 522 to the package substrate 518. Base die 522 may be positioned in interposer cavity 514 of an integrated stepped interposer module or between two stepped interposer modules 516. For example, attaching base die 522 to substrate 518 using reflow or thermal compression bonding processes.

Figure 5H:
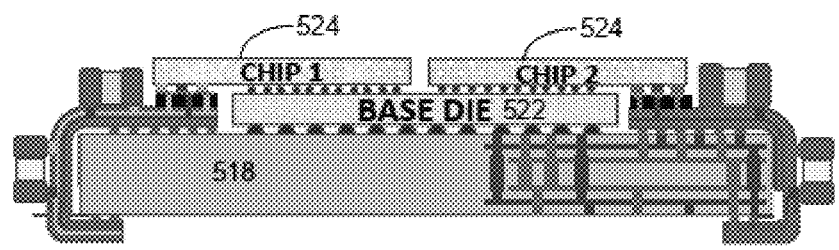

FIG. 5H illustrates attaching chiplets 524 to the VIA frames 510 of the taller step of stepped interposer modules 516 and the base die 522. For example, attaching chiplets 516 using reflow or thermal compression bonding processes.

Figure 5I:
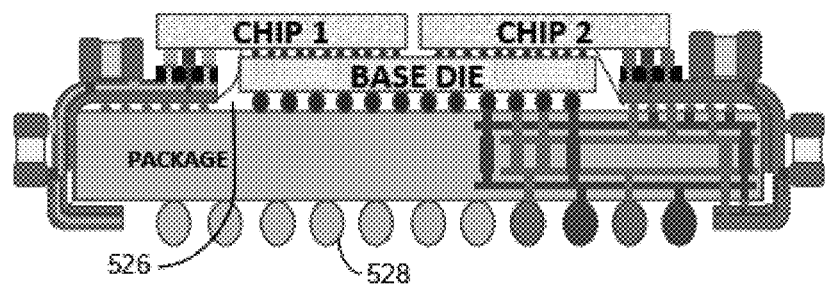

FIG. 5I illustrates providing underfill layer 526 and attaching solder balls 528. For example, providing underfill layer 526 using a capillary dispensing process. For example, attaching solder balls 528 using surface mounting or reflow processes.

Figure 6:
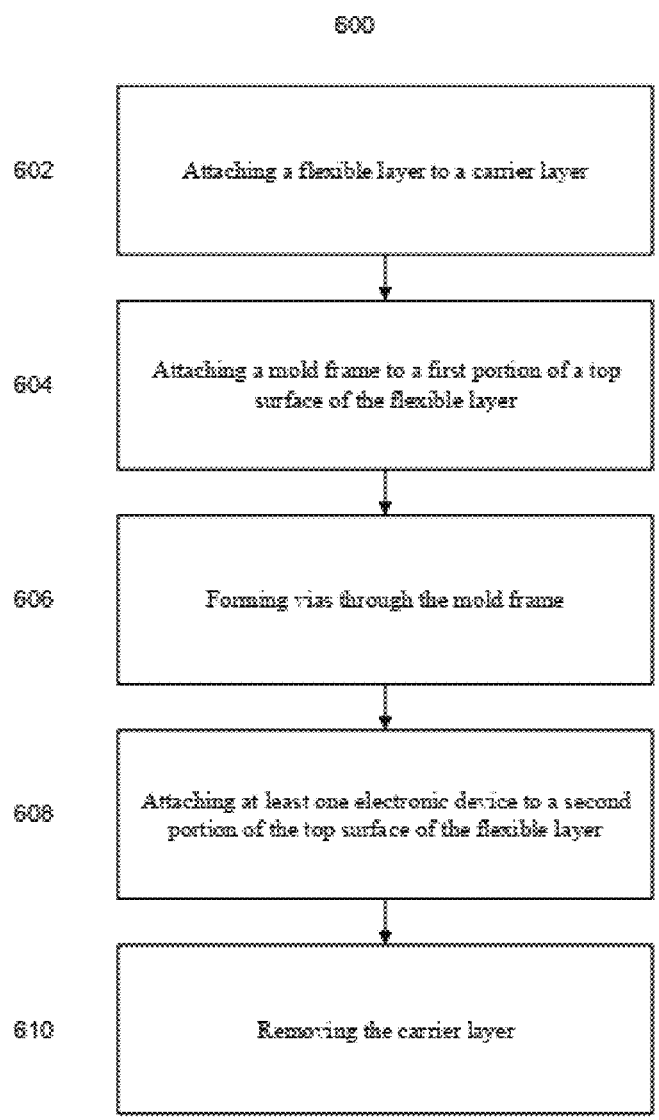
FIG. 6 shows a flow chart illustrating an exemplary method 600 of method of manufacturing stepped interposer module frames according to some aspects.

FIG. 6 illustrates an exemplary method 600 of method of manufacturing stepped interposer module frames according to some aspects. As shown in FIG. 6, method 600 includes attaching a flexible layer to a carrier layer (602), attaching a mold frame to a first portion of a top surface of the flexible layer (604), forming vias through the mold frame (606), attaching at least one electronic device to a second portion of the top surface of the flexible layer (608), and removing the carrier layer (610).

Package capacitors are cost-effective decoupling solution for chip packages, but may increase package form factor and/or Z-height. MIMCap facilitates device miniaturization, but with a high product cost and manufacturing complexity. Use of such decoupling options is limited to advance silicon process node because of silicon area and manufacturing cost considerations. For example, 7 nm, 5 nm or 3 nm silicon process node technologies for incorporating decoupling devices. Package capacitors are increasingly prohibited in small form-factor mobile devices, which increase reliance on high density metal-insulator-metal (MIM) technology to achieve targeted device performance in miniaturized devices. The constraints of incorporating decoupling devices poses design complexity on active or passive interposers. Essential and desktop platform segments are highly cost sensitive, which prohibits the use of high density MIM for power delivery. Thus, chip packages may have to tradeoff between an increased package form factor from incorporating additional capacitors or decreased device performance.

Incorporating electronic devices such as capacitors or I/O chips into chip packages may involve trade-offs. For example, increased system form factor and/or device z-height profile and device performance trade-off. Chip packages may incorporate ceramic capacitors on package top side, such as a die-side capacitor, and/or bottom side, such as a land-side capacitor. Additionally, they may include silicon MIM capacitance on active die and/or passive interposers. Other alternatives may include the use of embedded package or deep trench capacitors and constrained current loading for power delivery noise reduction via I/O de-featuring.

Chip packages may improve power delivery without increasing chip size or form factor and increasing production costs. Introducing a stepped interposer module frame to improve power delivery for a 2.5D stacked integrated circuit (IC) package may accomplish improved power delivery performance without significantly increasing package cost or size. An interposer module frame may be positioned within the chip package to create a space from a base die. A chip package may include two interposer module frames at opposite ends of a package substrate. The space between the two interposer module frames may be referred to as an interposer cavity. The interposer module frames at opposite ends of the package substrate may form an integrated structure with a cavity between the module frames. The interposer module may include two steps where the first step has a lower height than the second step. The two steps are adjacent to each other and each step includes frame vias (FVs) extending through at least a portion of the height of each step. The FVs extending through both steps are coupled through lateral frame routing. An electronic component may be disposed on the shorter step and coupled to the FVs extending through the shorter step. For example, an I/O chip or a capacitor may be disposed on the shorter step. Another electronic component may be disposed on the taller step and coupled to the FVs extending through the taller step. For example, a silicon die or chiplet may be disposed on the taller step. The electronic components disposed on the shorter and taller steps may be coupled to each other through lateral frame routing connecting the FVs extending through the shorter step and the FVs extending through the taller step.

The two-step or stepped interposer module frame may include two layers. A flexible layer may form the shorter step and the bottom layer of the interposer module. The taller step may include a mold frame positioned on a top surface of the flexible layer. Both steps include FVs extending through at least a portion of its height. For example, FVs in the taller step may extend from the flexible layer through the mold frame. The flexible layer may partially encircle a package substrate. For example, the flexible layer may be disposed over a top surface, bottom surface and side of the package substrate.

Electrical components such as capacitors or I/O chips may be included in a chip package by disposing them over the shorter step or flexible layer. For example, several capacitors may be disposed over the flexible layer extending over the package substrate without increasing the package form factor or significantly increasing production costs. Package real estate associated with package die-side capacitor or land-side capacitor "keep-out zones" may not be required by attaching passive components to the interposer module frame instead of package substrate. Additionally, package I/O pin count may be reduced because chiplets and devices may be interconnected through the two-step interposer module. The two-step interposer module frame may mitigate AC noise, thus aiding in increased signal transmission data-rate, computing core performance, or graphics Fmax performance gain. For example, through Vmin improvements and impedance loadline reduction. The two-step interposer module may minimize device power consumption because it allows lower power supply nominal voltage setpoint through, for example, improved power delivery network (PDN) parasitic. Finally the stepped interposer module frame improves silicon wafer fabrication throughput through avoidance of high density MIM capacitance.

A 2.5D stacked integrated circuit package with a stepped interposer module may improve power delivery and allow device miniaturization. The stepped interposer module may include a module device side and an opposing module package side. For example, the module package side may be the bottom surface of the module frame and the device side may the opposing side of the module having at least two steps. The interposer module frame may be coupled to the package substrate through a plurality of solder bumps between the package substrate and the interposer module frame package side. The device side of the interposer module may include steps of different heights. Additionally, the interposer module may include a space between itself and another interposer module disposed over an opposite end of the substrate package. The space may be referred to as the interposer cavity.

The stepped interposer module frame may be made from several different materials. For example, an organic mold substrate, a ceramic substrate, or a silicon-based substrate. The interposer module frame may also include FVs extending through at least a portion of each of its steps. For example, some FVs may extend through a portion of a shorter step and some FVs may extend through a portion of a taller step. The shorter step may be a flexible layer forming the base of the interposer module frame. The taller step may be a mold frame attached to the flexible layer. FVs in the taller step may be coupled to FVs in the shorter step coupled through a lateral frame routing.

Chip packages may include two stepped interposer module frames disposed at opposite ends of a substrate package. A base die may be disposed directly over and coupled to the package substrate within the interposer cavity. For example, an active die or passive interposer may be positioned in the interposer cavity and coupled to the package substrate through a plurality of solder bumps. The base die may include through silicon vias (TSVs) extending at least partially through the base die. Each stepped interposer module may include a chiplet disposed over a portion of the base die and the taller step of the interposer frames. For example, a chiplet may include a central processing unit (CPU), a graphic processing unit (GPU), a system-on-chip (SOC), a platform controller hub (PCH), a memory device, or a field programmable gate array (FPGA) device. A chip package may include a base die coupled to a package substrate with an interposer module opposite each end of the base die. One type of chiplet may be coupled to an interposer module and the base die at one end and another type of chiplet may be coupled to another interposer module and the base die at the other end. For example, two interposer modules may be coupled to a package substrate at opposite ends of the package substrate creating an exposed substrate surface on the substrate between the two interposers. A passive interposer may be coupled to the package substrate in between the two interposer modules. At one end, a CPU chiplet may be attached to the taller step of the first stepped interposer module and the passive interposer. At the other end a PCH chiplet may be attached to the taller step of the second stepped interposer module and the passive interposer.

Additionally, electronic components may be attached to the shorter step of the stepped interposer modules. For example, the electronic components may include passive components such as capacitors, inductors, resistors, or voltage regulators may be disposed on the first step of the stepped interposer frame. As another example, the electronic components may include a transceiver device, an I/O tile, a memory device, a sensor, or a power management integrated circuit (PMIC). The chiplets may be coupled to the electronic components through the FVs and lateral routing of the stepped interposer module. Improved power delivery to a chiplet can be achieved through shorter AC loop inductance between the chiplet attached to the taller step of the interposer and decoupling capacitors attached to the shorter step of the interposer module which are connected through FVs and lateral frame routing of the interposer module. In one example, the decoupling capacitor may be multi-layer ceramic capacitor (MLCC) or a silicon capacitor.

The stepped interposer module's lateral routing may facilitate a reference voltage connection such as a power supply voltage (Vcc) or a ground reference voltage (Vss) for power delivery. The lateral routing of the stepped interposer module may be coupled to the package substrate through a plurality of solder bumps between the bottom surface of the interposer module and the top surface of the package substrate. Electronic components attached to the shorter step of the interposer module may be coupled to the base die through the FVs and lateral routing of the interposer module and lateral routing of the package substrate to facilitate power delivery. For example, a capacitor connected to the shorter step of the interposer module may supply electric charges or alternating current (AC) to the base die.

Additionally, the stepped interposer module's lateral routing may facilitate transmission of a data signal between electronic devices coupled to the shorter step of the interposer module and chiplets attached to the taller step of the same interposer module, chiplets attached to the taller step of a different interposer module, or the package substrate. For example, a high-speed I/O differential signal and/or a single-ended signal may be transmitted between the device coupled to the shorter step and the chiplets attached to the taller step of a first and/or second interposer module.

For example, the path for power delivery from the capacitor to the base die may include electrical connections between the capacitor and the FVs of the shorter step of the interposer module. The path continues through the FVs and lateral routing of the interposer module. The interposer module may be connected to the lateral routing of the package substrate through solder bumps between FVs of the interposer module and the package substrate. The lateral routing of the package substrate may direct a path from the interposer module to the solder bump connections between the package substrate and the base die.

Attaching passive components to the shorter step of the stepped interposer module, as opposed to directly attaching them to the package substrate, reduces package real estate associated with contact pads for mounting passive components. Additionally, keep-out-zones of the package substrate reserved for mechanical assembly may be avoided.

Forming the shorter step of the stepped interposer module from a flexible cable allows more real estate for electrical components in the chip package without having to attach them directly to the package substrate. The shorter step of the interposer module frame may include a flexible portion extending over the top, side and bottom of the package substrate. For example, a portion of the flexible cable may be positioned on the top surface of the package substrate and may wrap around a peripheral sidewall of the package substrate which is perpendicular to the packages substrate's top surface and may further wrap around a bottom surface of the package substrate which is opposite and parallel to the top surface.

The stepped interposer module may include two steps of different heights. The two steps are parallel to each other, and when the interposer module is position on the package substrate the two steps are parallel to the top surface of the package substrate. The bottom surface of the interposer module, opposite the steps, is flat and lateral to the top surface of the package substrate. The interposer module may include a flexible cable as the shorter step, the portion of the shorter step attached to the top surface of the of the package substrate is lateral to the top surface of the package substrate. The portion of the flexible cable wrapped around a peripheral sidewall is lateral to the peripheral sidewall of the package substrate.

Electrical components may be attached to the flexible portion of the stepped interposer module along the portions that are lateral to the top surface of the package substrate or lateral to the peripheral sidewall of the package substrate. For example, passive components such as capacitors may be attached to the portion of the flexible cable, shorter step of the interposer module, that is lateral to the top surface of the package substrate. Further passive components may be attached to another portion of the flexible cable that is lateral to the peripheral sidewall of the package substrate. Further, a portion of the flexible cable may wrap around and electrically couple to the bottom surface of the package substrate. The flexible cable of the stepped interposer module may be electrically coupled to the package substrate through solder interconnections to facilitate power delivery from the capacitors to the package substrate. For example, the flexible portion may include different conductive planes associated with different voltages, such as power supply voltages (Vcc) and ground reference voltages (Vss), to facilitate power delivery and/or connection between the different capacitors and chiplets attached to the taller step of the interposer modules. Creating more real estate for attaching different capacitors allows improved delivery of different power supply voltages that may be required by different components.

Passive components such as capacitors may be attached to the flexible cable wrapped around the peripheral sidewall of the package substrate. Unlike typical package LSC or DSC assembly, capacitor height and form factor restrictions are less rigid when attaching capacitors laterally to the peripheral sidewall. A wider range of capacitor types may be selected to mitigate AC noise. Capacitors can be placed in vertical or horizontal orientation to maximize area utilization.

Two parallel power and ground loops may be formed which effectively allows a low AC decoupling loop for improved device performance. For example, a first power path from a decoupling capacitor attached to the shorter step of the interposer module to a chiplet attached to the taller step of the interposer module. The second path between the flexible portion of the interposer module electrically coupled to the bottom surface of the package substrate and the main power delivery path of the package which may branch out to the rest of the power delivery network within the package substrate.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

Example 1 is a chip package including a chip; a package substrate; an interposer module including a first layer and a second layer, wherein a second layer surface area is smaller than a first layer surface, wherein a bottom of the second layer is attached to a top of the first layer area creating an exposed surface area, wherein the first layer is coupled to the package substrate; a first plurality of via openings extending at least partially through the first layer; a second plurality of via openings extending at least partially through the first layer and the second layer; a plurality of conductive routing electrically coupled between the first plurality of via openings and the second plurality of via openings, wherein the chip is electrically coupled to the second plurality of via openings of a top of the second layer, wherein the substrate is electrically coupled to the first plurality of via openings or the second plurality of via openings of a bottom of the first layer; and an electronic component electrically coupled to the first plurality of via openings of the exposed surface area.

In Example 2, the subject matter of Example 1 may optionally further include wherein an electronic component is electrically coupled to the first plurality of via openings of a top surface of the first layer.

In Example 3, the subject matter of Examples 1 or 2 may optionally further include wherein the electronic component is a transceiver device.

In Example 4, the subject matter of Examples 1 to 3 may optionally further include wherein the electronic component is an I/O tile.

In Example 5, the subject matter of Examples 1 to 4 may optionally further include wherein the electronic component is a memory device.

In Example 6, the subject matter of Examples 1 to 5 may optionally further include wherein the electronic component is a sensor.

In Example 7, the subject matter of Examples 1 to 6 may optionally further include wherein the electronic component is a power management integrated circuit (PMIC).

In Example 8, the subject matter of Examples 1 to 7 may optionally further include wherein the electronic component is a passive component.

In Example 9, the subject matter of Examples 1 to 8 may optionally further include wherein the electronic component is a capacitor.

In Example 10, the subject matter of Examples 1 to 9 may optionally further include wherein the electronic component is an inductor.

In Example 11, the subject matter of Examples 1 to 10 may optionally further include wherein the electronic component is a resistor.

In Example 12, the subject matter of Examples 1 to 11 may optionally further include wherein the electronic component is a voltage regulator.

In Example 13, the subject matter of Examples 1 to 12 may optionally further include wherein the electronic component is a decoupling capacitor.

In Example 14, the subject matter of Examples 1 to 13 may optionally further include wherein the decoupling capacitor is a multi-layer ceramic capacitor (MLCC).

In Example 15, the subject matter of Examples 1 to 14 may optionally further include wherein the decoupling capacitor is a silicon capacitor.

In Example 16, the subject matter of Examples 1 to 15 may optionally further include, wherein a base die is positioned between the chip and the substrate.

In Example 17, the subject matter of Examples 1 to 16 may optionally further include wherein the base die is electrically coupled to the chip and electrically coupled to the substrate.

Example 18 is a method of forming an interposer including attaching a flexible layer to a carrier layer; attaching a mold frame to a first portion of a top surface of the flexible layer; forming vias through the mold frame; attaching at least one electronic device to a second portion of the top surface of the flexible layer; forming a cavity through the flexible layer; and removing the carrier layer.

In Example 19, the subject matter of Example 18 may optionally further include wherein the electronic component is a transceiver device.

In Example 20, the subject matter of Examples 18 or 19 may optionally further include wherein the electronic component is an I/O tile.

In Example 21, the subject matter of Examples 18 to 20 may optionally further include wherein the electronic component is a memory device.

In Example 22, the subject matter of Examples 18 to 21 may optionally further include wherein the electronic component is a sensor.

In Example 23, the subject matter of Examples 18 to 22 may optionally further include wherein the electronic component is a power management integrated circuit (PMIC).

In Example 24, the subject matter of Examples 18 to 23 may optionally further include wherein the electronic component is a passive component.

In Example 25, the subject matter of Examples 18 to 24 may optionally further include wherein the electronic component is a capacitor.

In Example 26, the subject matter of Examples 18 to 25 may optionally further include wherein the electronic component is an inductor.

In Example 27, the subject matter of Examples 18 to 26 may optionally further include wherein the electronic component is a resistor.

In Example 28, the subject matter of Examples 18 to 27 may optionally further include wherein the electronic component is a voltage regulator.

In Example 29, the subject matter of Examples 18 to 28 may optionally further include wherein the electronic component is a decoupling capacitor.

In Example 30, the subject matter of Examples 18 to 29 may optionally further include wherein the electronic component is a multi-layer ceramic capacitor (MLCC).

In Example 31, the subject matter of Examples 18 to 30 may optionally further include wherein the electronic component is a silicon capacitor.

In Example 32, the subject matter of Examples 1 to 17 may optionally further include wherein the first layer comprises a flexible material.

In Example 33, the subject matter of Examples 1 to 17 and 32 may optionally further include wherein the first layer is electrically coupled to a land side of the substrate.

Example 44 is a non-transitory computer readable medium storing instructions that, when executed by one or more processors of a manufacturing device, cause the manufacturing device to perform the method of any one of Examples 18 to 31.

Example 45 is a chip package including a chip; a package substrate; an interposer module comprising a first layer and a second layer, wherein a second layer surface area is smaller than a first layer surface, wherein a bottom of the second layer is attached to a top of the first layer area creating an exposed surface area, wherein the first layer is coupled to the package substrate; and an electronic component electrically coupled to the exposed surface area.

In Example 46, the subject matter of Example 45 may optionally further include wherein the interposer module includes a first plurality of via openings extending at least partially through the first layer.

In Example 47, the subject matter of Examples 45 and 46 may optionally further include wherein the interposer module includes a second plurality of via openings extending at least partially through the first layer and the second layer.

In Example 48, the subject matter of Examples 45 to 47 may optionally further include wherein the interposer module includes a plurality of conductive routing electrically coupled between the first plurality of via openings and the second plurality of via openings.

In Example 49, the subject matter of Examples 45 to 48 may optionally further include wherein the chip is electrically coupled to the second plurality of via openings of a top of the second layer.

In Example 50, the subject matter of Examples 45 to 49 may optionally further include wherein the substrate is electrically coupled to the first plurality of via openings or the second plurality of via openings of a bottom of the first layer.

In Example 51, the subject matter of Examples 45 to 50 may optionally further include wherein the chip comprises a plurality of chiplets coupled to a second interposer, wherein the second interposer is disposed on the package substrate adjacent to the interposer module.

In Example 52, the subject matter of Examples 45 to 51 may optionally further include wherein the plurality of chiplets is disposed over a portion of the interposer module and a portion of the second interposer.

In Example 53, the subject matter of Examples 45 to 52 may optionally further include wherein the interposer module extends along at least one periphery of the second interposer.

In Example 54, the subject matter of Examples 45 to 53 may optionally further include wherein the second interposer is a silicon interposer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package comprising:
   a chip;
   a package substrate;
   an interposer module comprising a first layer and a second layer,
      wherein a second layer surface area is smaller than a first layer surface area,
      wherein a bottom of the second layer is attached to a top of the first layer surface area creating an exposed surface area,
      wherein the first layer is coupled to the package substrate;
   a first plurality of via openings extending at least partially through the first layer, wherein the first layer comprises a flexible material;
   a second plurality of via openings extending at least partially through the first layer and the second layer;
   a plurality of conductive routing electrically coupled between the first plurality of via openings and the second plurality of via openings,
      wherein the chip is electrically coupled to the second plurality of via openings of a top of the second layer,
      wherein the substrate is electrically coupled to the first plurality of via openings or the second plurality of via openings of a bottom of the first layer; and
   wherein the first plurality of via openings of the exposed surface area are configured to electrically couple to an electronic component.

2. The chip package of claim 1, wherein the electronic component is electrically coupled to the first plurality of via openings of a top surface of the first layer.

3. The chip package of claim 2, wherein the electronic component is a transceiver device.

4. The chip package of claim 2, wherein the electronic component is an I/O tile.

5. The chip package of claim 2, wherein the electronic component is a memory device.

6. The chip package of claim 2, wherein the electronic component is a passive component.

7. The chip package of claim 2, wherein the electronic component is a sensor.

8. The chip package of claim 2, wherein the electronic component is a power management integrated circuit (PMIC).

9. The chip package of claim 2, wherein the electronic component is a capacitor.

10. The chip package of claim 2, wherein the electronic component is an inductor.

11. The chip package of claim 2, wherein the electronic component is a resistor.

12. The chip package of claim 1, wherein the chip comprises a plurality of chiplets coupled to a second interposer, wherein the second interposer is disposed on the package substrate adjacent to the interposer module.

13. The chip package of claim 12, wherein the plurality of chiplets is disposed over a portion of the interposer module and a portion of the second interposer.

14. The chip package of claim 12, wherein the interposer module extends along at least one periphery of the second interposer.

15. The chip package of claim 12, wherein the second interposer is a silicon interposer.

16. The chip package of claim 1, wherein the first layer is electrically coupled to a land side of the substrate.

* * * * *